(12) United States Patent  
Hyobu

(10) Patent No.: US 6,336,567 B1  
(45) Date of Patent: Jan. 8, 2002

(54) MAGNETIC SECURED CONTAINER CLOSURE WITH RELEASE BY MOVEMENT OF MAGNETIC MEMBER

(75) Inventor: Yukihiro Hyobu, Tokyo (JP)

(73) Assignee: Kakizaki Manufacturing Co., Ltd. (JP)

( * ) Notice: Subject to any disclaimer, the term of this patent is extended or adjusted under 35 U.S.C. 154(b) by 0 days.

(21) Appl. No.: 09/230,760

(22) PCT Filed: Jun. 13, 1997

(86) PCT No.: PCT/JP97/02044

§ 371 Date: Feb. 1, 1999

§ 102(e) Date: Feb. 1, 1999

(87) PCT Pub. No.: WO98/56676

PCT Pub. Date: Dec. 17, 1998

(51) Int. Cl.[7] .............................................. B65D 51/00
(52) U.S. Cl. ...................... 220/230; 220/378; 220/262; 220/304
(58) Field of Search ................................ 220/230, 378, 220/255, 256, 211, 260, 262, 304, 789, 795; 335/306; 318/116

(56) References Cited

U.S. PATENT DOCUMENTS

| | | | |
|---|---|---|---|
| 2,387,990 A | * 10/1945 | Grosser | ................... 220/304 X |
| 3,616,962 A | * 11/1971 | Phipps | ........................ 220/789 |
| 3,744,833 A | * 7/1973 | Berducone | |
| 3,835,338 A | * 9/1974 | Martin | |
| 4,110,552 A | * 8/1978 | Lombardi | ................ 220/230 X |
| 4,231,486 A | * 11/1980 | Bock | ...................... 220/789 X |
| 4,375,863 A | * 3/1983 | Kappler | ................... 220/230 X |
| 4,580,694 A | * 4/1986 | Hempelmann et al. | . 220/378 X |
| 4,754,185 A | * 6/1988 | Gabriel et al. | |
| 4,778,254 A | * 10/1988 | Gilliland, III et al. | |
| 5,067,625 A | * 11/1991 | Numata | ................... 220/230 X |
| 5,135,012 A | * 8/1992 | Kamen et al. | .......... 220/230 X |
| 5,475,355 A | * 12/1995 | Abele et al. | |
| 5,534,663 A | * 7/1996 | Rivers et al. | ........... 220/230 X |
| 5,583,716 A | * 12/1996 | Akiba et al. | |
| 5,829,622 A | * 11/1998 | Neuman | ...................... 220/230 |
| 6,076,696 A | * 6/2000 | Neuman | ...................... 220/230 |
| 6,108,162 A | * 8/2000 | Amirkiai et al. | |
| 6,208,044 B1 | * 3/2001 | Viswandham et al. | |

FOREIGN PATENT DOCUMENTS

| | | | | |
|---|---|---|---|---|
| DE | 441905 | * | 1/1926 | ................. 220/304 |
| DE | 3921540 | * | 9/1955 | ................. 220/230 |
| DE | 4234558 | * | 4/1994 | |
| FR | 1101088 | * | 9/1955 | ................. 220/378 |
| FR | 1166642 | * | 4/1958 | ................. 220/378 |
| FR | 1217571 | * | 5/1960 | ................. 220/378 |

(List continued on next page.)

Primary Examiner—Allan N. Shoap  
Assistant Examiner—Robin A. Hylton  
(74) Attorney, Agent, or Firm—Lorusso & Loud

(57) ABSTRACT

A container for a plurality of thin plates has a driving unit for moving one of a pair of magnetic members, at least one of which is a magnet, embedded in a container body and contained in a chamber in a lid, respectively, to selectively produce attractive and non-attractive magnetic conditions between the first and second magnetic members. In one embodiment, the driving unit includes a rotatable plate, and an arm having one end attached to the rotatable plate and the second end attached to the movable magnetic member to move the movable magnetic member in response to rotation of the rotatable plate. In a second embodiment a parallel movement link has a long groove for engaging a pin provided on the rotatable plate; a magnetic member supporting link has a first end attached to one end of the parallel movement link and has its second end attached to the movable magnetic member. In a third embodiment the rotatable plate has a first bevel gear meshing with a second bevel gear on a shaft supporting the movable magnetic member.

4 Claims, 9 Drawing Sheets

| | FOREIGN PATENT DOCUMENTS | | |
|---|---|---|---|
| JP | 57-7908 | * | 1/1982 |
| JP | 60160539 | | 10/1985 |
| JP | 6287442 | | 6/1987 |
| JP | 63131948 | | 8/1988 |
| JP | 185292 | | 6/1989 |
| JP | 196860 | | 6/1989 |
| JP | 3215960 | | 9/1991 |
| JP | 627954 | | 7/1994 |
| JP | 6183467 | | 7/1994 |
| JP | 945759 | | 2/1997 |
| NL | 45855 | * | 6/1939 ................. 220/304 |

* cited by examiner

MAGNETIC SECURED CONTAINER CLOSURE WITH RELEASE BY MOVEMENT OF MAGNETIC MEMBER

TECHNICAL FIELD

The present invention relates to a lid-mounted thin-plate housing container for housing and supporting a plurality of thin plates, such as silicon wafers used for producing semiconductors, hard memory disks (magnetic disks), substrates of compact disks (CD) or the like, glass substrates of LCD and so on at one time for transfer, storage and the like purposes.

BACKGROUND ART

Generally speaking, when thin plates, such as silicon wafers or the like, are handled, they are housed in a thin-plate housing container (for example, a wafer carrier or the like). In such a thin-plate housing container, a plurality of thin plates are supported in such a manner as to be disposed in parallel with one another and spaced at predetermined intervals, and they are handled at the same time.

Among such thin-plate containers, there is a type in which an easily detachable lid is mounted. The lid is provided to prevent an event that dusts or the like enter the container from outside and adhere on the surfaces of the thin plates housed in the container. For this purpose, the lid is adapted to be secured to the thin-plate housing container so as to tightly seal the interior of the container body. Securing means for securing the lid is usually constituted by an engagement claw and an engagement hole which engage with each other so as to secure the lid to the container body.

However, when the securing means is constituted by the engagement claw and the engagement hole, the following problem arises. Specifically, when the engagement claw fits into the engagement hole, friction is caused therebetween. The friction thus caused generates dusts or the like which adhere on the surfaces of the thin plates.

The present invention is accomplished in view of the above-mentioned problem. An object of the present invention is to provide a lid-mounted thin-plate housing container in which a lid can be steadfastly mounted while preventing generation of dusts or the like.

DISCLOSURE OF INVENTION

According to the present invention, there is provided a lid-mounted thin-plate housing container having a container body for housing and supporting a plurality of thin plates, and a lid detachably mounted to the container body for sealing the interior of the container body, the container comprising a magnetic force operating unit for operating magnetic force generated between the container body and the lid, wherein the lid having been mounted on the container body is secured to the container body by means of the magnetic force.

Owing to this configuration, when the magnetic force operating unit generates attractive magnetic force which causes the lid and the container body to attract each other, the lid is secured to the container body. In contrast, when the magnetic force operating unit eliminates the attractive magnetic force, or when the magnetic force operating unit generates repulsive magnetic force, the lid is released from the container body. Thereby, the lid can be easily removed.

Also, according to the present invention, the above-mentioned magnetic force operating unit includes: magnets, or a magnet and a magnetic member, which are provided at positions corresponding to each other, one of the positions lying in the container body, and the other one of the positions lying in the lid; and driving means for moving one of the magnets, or one of the magnet and the magnetic member, whereby magnetic force is controlled by moving one of the magnets, or one of the magnet and the magnetic member, by means of the driving means so that the lid is secured to or released from the container body.

Owing this configuration, when one of the magnets, or one of the magnet or the magnetic member, is moved by means of the driving means, the magnetic force generated between the container body and the lid changes. Specifically, when the magnets are aligned with each other, or when the magnet is aligned with the magnetic member, attractive magnetic force is generated between the lid and the container body, whereby the lid is secured to the container body. In contrast, when the magnets are displaced from each other, or when the magnet is displaced from the magnetic member, the attractive magnetic force generated therebetween is eliminated, whereby the lid is released from the container body. Thereby, the lid can be easily removed.

Further, according to the present invention, the above-mentioned magnetic force operating unit includes a coil and a magnetic member provided at positions corresponding to each other, one of the positions lying in one of the container body and the lid, and the other one of the positions lying in the other one of the container body and the lid; and a control unit for controlling electric current to flow through the coil.

Owing to this configuration, when the electric current to flow through the coil is controlled by means of the control unit, the magnetic force generated between the coil and the magnetic member changes. When the coil generates attractive magnetic force between the coil and the magnetic member, the lid is secured to the container body. In contrast, when the electric current is stopped so as to eliminate the magnetic force, or when the electric current is caused to flow in the reverse direction so as to generate repulsive magnetic force, the lid having been secured to the container body is released therefrom. Thereby, the lid can be easily removed.

Furthermore, according to the present invention, there is provided a lid-mounted thin-plate housing container having a container body for housing and supporting a plurality of thin plates, and a lid detachably mounted to the container body for sealing the interior of the container body, wherein the lid includes a lid body, a lid plate, and a seal provided along the entire of an abutting end portion of the lid body, the abutting end portion of the lid body being adapted to abutting contact with the lid plate. Also, the seal has a tongue portion which greatly protrudes outwardly beyond the abutting end portion. The tongue portion seals a gap formed between the lid plate of the lid and an abutting end portion of the container body, the abutting end portion of the container body being adapted to abutting contact with the lid plate, or a gap formed between an outside wall of the abutting end portion of the lid body and the inside wall of the abutting end portion of the container body.

Thereby, the internal atmospheric pressure in the container body is prevented from rising, whereby the interior of the container body is reliably sealed.

BEST MODE FOR CARRYING OUT THE INVENTION

The best mode for carrying out the present invention will be described referring to the attached drawings.

Figure 2:
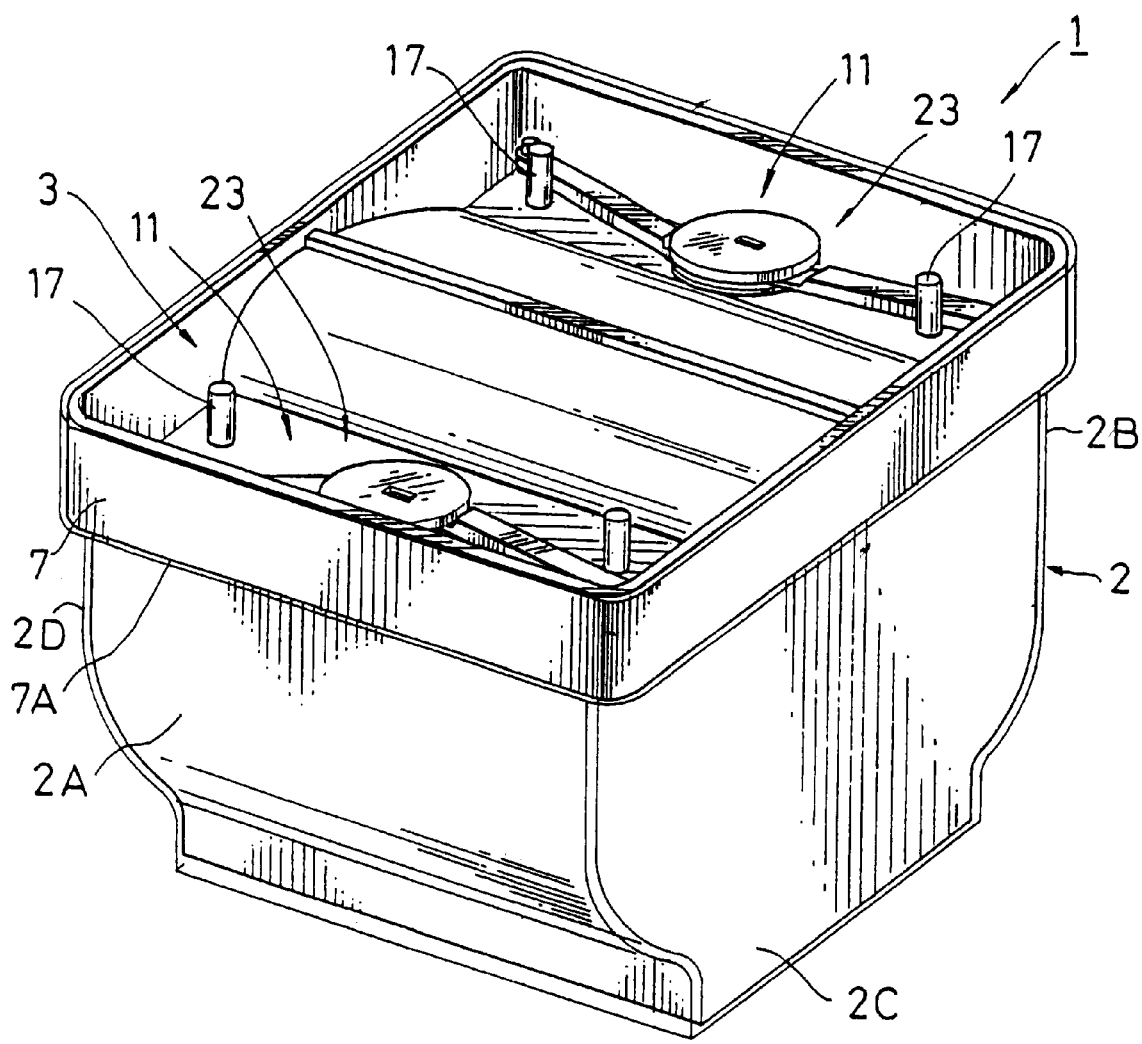
FIG. 2 is a perspective view showing the lid-mounted thin-plate housing container 1 in a state in which the lid plate 13 of the lid 3 is removed.
Figure 3:
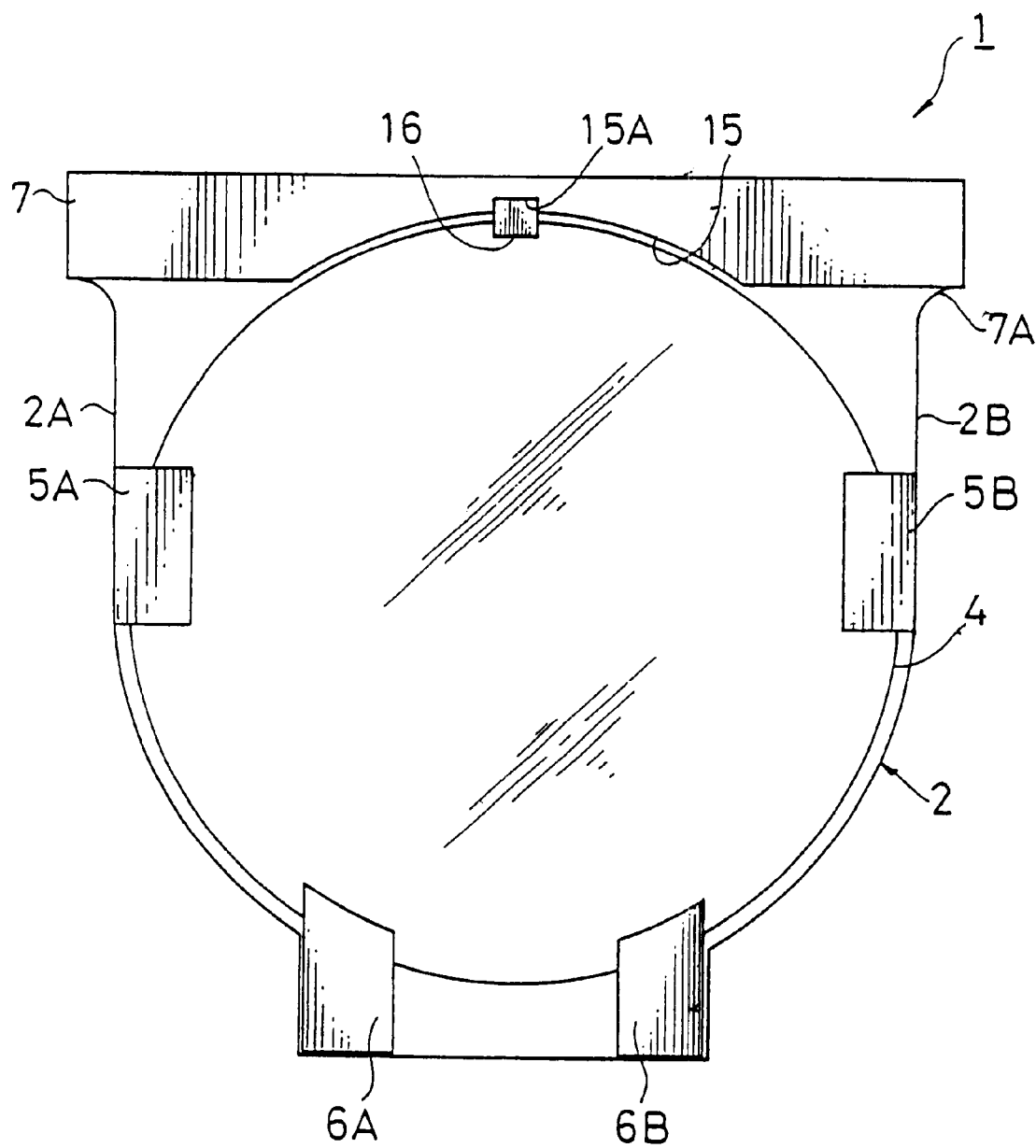
FIG. 3 is an elevational view showing a lid-mounted thin-plate housing container 1 according to the present invention.

Referring to FIGS. 2 and 3, a lid-mounted thin-plate housing container 1 according to an embodiment of the present invention generally includes a container body 2 for housing and supporting a plurality of silicon wafers 4 serving as thin plates, and lid 3 detachably mounted on the container body 2 for sealing the interior of the container body 2.

The container body 2 is constituted by side walls 2A and 2B, a front end wall 2C, and a rear end wall 2D. Each of the walls 2A, 2B, 2C and 2D is made of transparent synthetic resin so that the silicon wafers 4 housed in the container body 2 can be observed from outside. Each of the end walls 2C and 2D is provided with an engagement claw (not shown), which is gripped by a robot arm (not shown) when the container 1 is transferred by a robot, and with positioning means (not shown) for positioning the container 1 at a predetermined place so as to set the container 1 thereat. In the interior of the container body 2, there are provided side portion supporting teeth 5A and 5B and bottom portion supporting teeth 6A and 6B. Each of the teeth 5A, 5B, 6A and 6B is adapted to support the plurality of silicon wafers 4 housed in the container body 2 one by one while spacing out the silicon wafers 4 by a predetermined distance from neighboring wafers. Each of the teeth 5A, 5B, 6A and 6B has a plurality of notches which receive the silicon wafers 4 one by one. The side portion supporting teeth 5A and 5B are provided on the upper portions of the inside surfaces of the side walls 2A and 2B, respectively, in the container body 2, while the bottom portion supporting teeth 6A and 6B are provided on the lower portions of the inside surfaces of the side walls 2A and 2B, respectively, in the container body 2. Thereby, the side portion supporting teeth 5A and 5B are adapted to support the side portions of the silicon wafers 4 while the bottom portion supporting teeth 6A and 6B are adapted to support the bottom portions of the silicon wafers 4. The supporting teeth 5A, 5B, 6A and 6B can be detached from the container 1 so that they can be washed efficiently.

A lid housing portion 7 is formed in the upper portion of the container body 2. The lid housing portion 7 is adapted to receive the lid 3 to fit thereinto and house the lid 3 therein. The lid housing portion 7 is formed by broadening the upper portion of the container body 2 in such a shape as to match with that of the lid 3. Magnets 8 are embedded at four corners of an enlarged stage portion 7A of the lid housing portion 7, as shown in FIG. 5.

Figure 1:
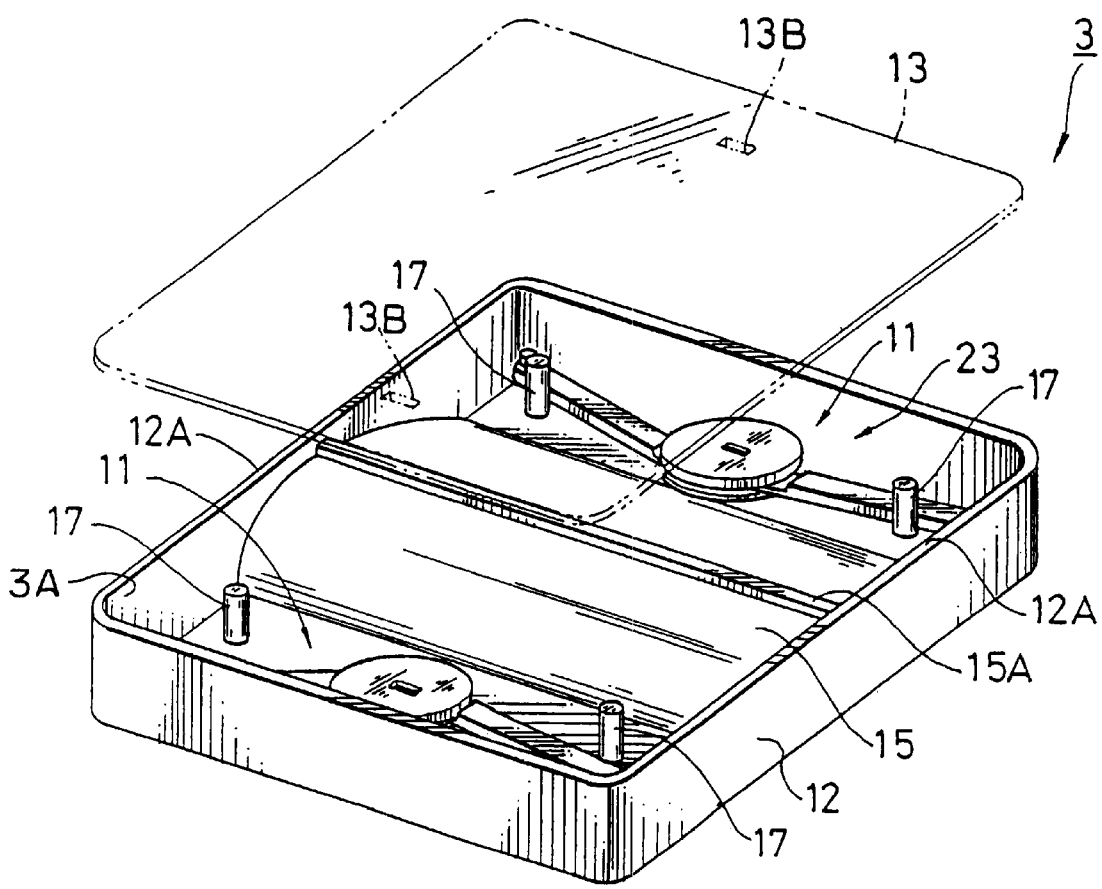
FIG. 1 is a perspective view showing a lid-mounted thin-plate housing container 1 according to the present invention (in a state in which the lid plate 13 is removed)
Figure 5:
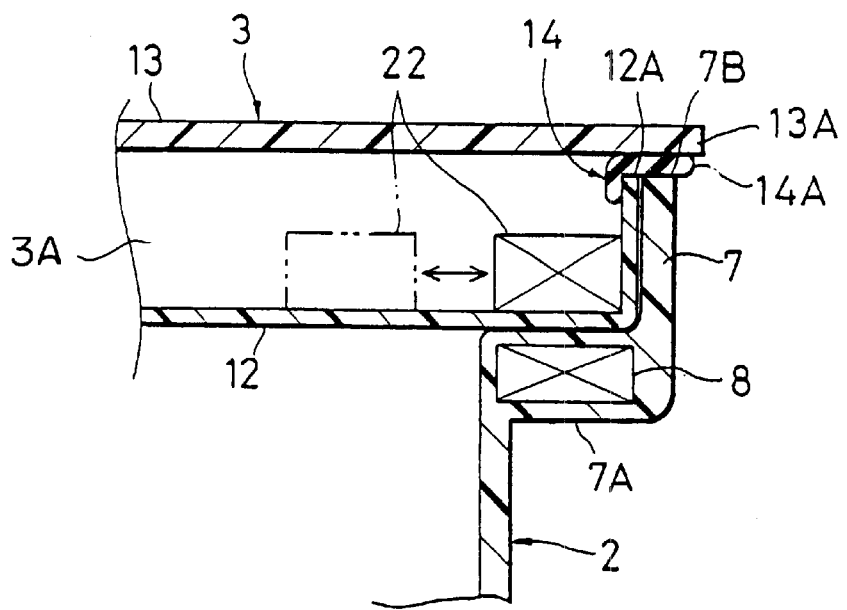
FIG. 5 is a sectional view showing a main portion of a container body 2 in a state in which the lid 3 is housed in the lid housing portion of the container body 2.

The lid 3 is constituted, as shown in FIGS. 1 and 5, by a lid body 12 for housing therein a magnetic force operating unit 11, a lid plate 13 for covering one side of the lid body 12, and a seal 14 which is provided along the entire abutting end portion 12A formed in the lid body 12 (upper end portion of the lid body 12 (see FIG. 5), the abutting end portion 12A serving to abutting contact with the lid plate 13.

The lid body 12 is formed in the shape of a rectangular shallow basin so that the lid body 12 can fit into the lid housing portion 7 of the container body 2. The bottom of the lid body 12 is formed with a raised portion whose cross section is in the shape of a circular arc, as shown in FIGS. 1 and 3. The raised portion is adapted to cover the upper portions of the silicon wafers 4 housed in the container body 2 and to support the silicon wafers 4. At the center portion of the raised portion 15, there is formed a long groove 15A whose bottom is open and which houses therein a resilient supporting member 16 made of rubber or the like. The resilient supporting member 16 is adapted to abutting contact with the upper end portions of the plurality of silicon wafers 4 housed in the container body 2 so as to steadfastly support the silicon wafers 4. At the four corners of the lid body 12, there are provided supporting poles 17 for securing the lid plate 13 to the lid body 12 to form a substantially enclosed lid chamber 3A.

The size of the lid plate 13 is slightly larger than that of the lid body 12, as shown in FIG. 5. The lid plate 13 has eaves 13A which protrudes outwardly beyond the circumference of the lid body 12. The seal 14 is attached on the inside surface of the abutting end portion 12A of the lid body 12. The cross section of the seal 14 is L-shaped, and the fore end portion of the seal 14 forms a tongue portion 14A. The seal 14 is provided in such a manner that the base end portion thereof is adhered on the inside surface of the abutting end portion 12A while the fore end portion thereof, serving as the tongue portion 14A, greatly protrudes outwardly beyond the abutting end portion 12A and is adhered on the lower surface of the eaves 13A of the lid plate 13. Owing to this configuration, even when the lid body 12 of the lid 3 does not match with the lid housing portion 7 of the container body 2 (that is, even when the lid body 12 is smaller than the lid housing portion 7 so that the lid body 12 is displaced transversely or longitudinally), the tongue portion 14A is clamped between the abutting end portion 7B of the lid housing portion 7 and the eaves 13A, the abutting end portion 7B serving to abutting contact with the eaves 13A. Thereby, the interior of the container body 2 is reliably sealed. Further, owing to the position where the seal 14 is provided, the container body 2 is kept unsealed till the moment immediately before the lid 3 is completely housed in the lid housing portion 7, so that the inner atmospheric pressure within the container body 2 can be prevented from rising. It should be noted that examples of the material of the seal 14 include polyester series elastomers, silicon series elastomers, plyolefin series elastomers, plystyrene/plyolefin block polymer series elastomers, synthetic rubbers, and so on.

On the upper surface of the lid plate 13, there are formed two long holes 13B, as shown in FIG. 1. Each of the two long holes 13B is adapted to allow fore end portion A of a robot arm (hereinafter referred to as "robot-arm fore-end portion A") to be inserted therethrough (see FIG. 6). When the robot-arm fore-end portion A is inserted through the long holes 13B, the robot-arm fore-end portion A fits into the magnetic force operating unit 11. Thereby, when the robot-arm fore-end portion A is rotated by 45 degrees, the robot-arm fore-end portion A engages with the long hole 13B and causes the magnetic force operating unit 11 to operate.

At an upper portion of the container body 2 and a portion of the lid 3, there are provided two magnetic force operating units 11. The magnetic force operating units 11 are adapted to operate the magnetic force produced between the container body 2 and the lid 3 so as to secure the lid 3 to the lid housing portion 7 of the container body 2. Each of the magnetic force operating units 11 is composed of two magnets 8 and two magnets 22, and one driving means 22 for moving either ones of the magnets 8 and 22.

The magnets 8, whose number is four in total, are embedded respectively at the four corners of the extended stage portion 7A of the lid housing portion 7, as descried above. The magnets 22 are provided in the chamber 3A in the lid body 12 of the lid 3 in such a manner as to be fixedly attached on the driving means 23 also in chamber 3A.

Figure 4:
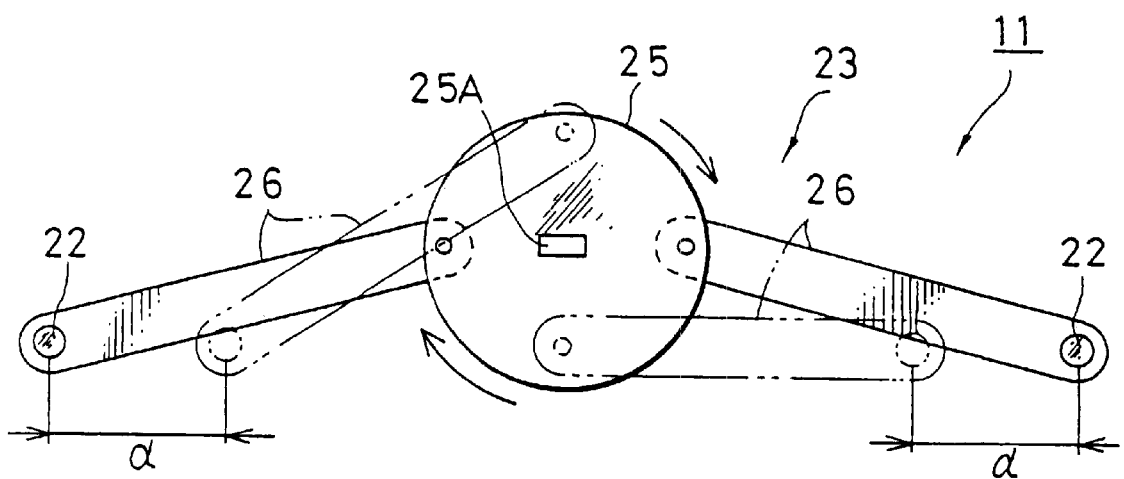
FIG. 4 is a plan view of a magnetic force operating unit 11.

The driving means 23 are provided at two positions in the lid body 12 of the lid 3, and each of the driving means 23 is adapted to support two magnets 22. A specific configuration of the driving means 23 is as shown in FIG. 4. In FIG. 4, reference numeral 25 denotes a rotational plate. At the center of the rotational plate 25, there is formed a long hole 25A with which the robot-arm fore-end portion A engages. The rotational plate 25 is provided at such a position as to enable the long hole 25A to be aligned with the long hole 13B of the lid plate 13. The rotational plate 25 is composed of a pair of two disks which oppose to each other and are spaced by a predetermined distance from each other. Reference numeral 26 denotes arms attached to the rotational plate 25. Each of the magnets 22 is provided in the fore end of each arm 26 while the base end portion of each of the arms 26 is rotatably supported by the rotational plate 25. Thereby, when the rotational plate 25 is rotated by 45 degrees by the robot-arm fore-end portion A, each magnet 22 moves by a distance a as shown by the imaginary lines in FIGS. 4 and 5, whereby the magnetic force is controlled. Specifically, when the respective magnets 22 are aligned with their corresponding magnets 8, the corresponding magnets 22 and 8 attract each other, whereby the lid 3 is secured to the container body 2. In contrast, when the respective magnets 22 are displaced from their corresponding magnets 8 by a distance a, the attractive magnetic force having been established between the corresponding magnets 8 and 22 disappears, whereby the lid 3 having been secured on the container body 2 is released therefrom.

Figure 6:
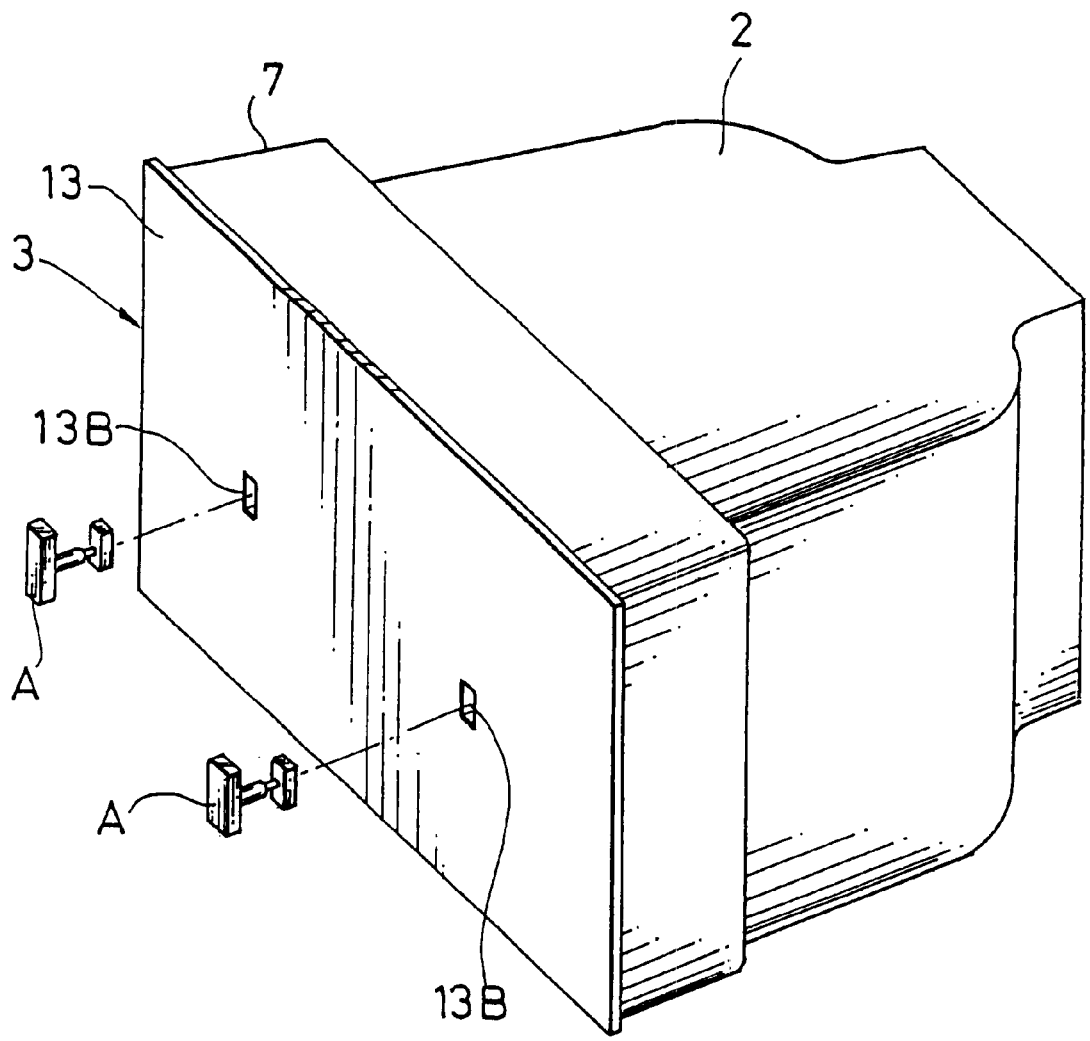
FIG. 6 is a perspective view showing the lid-mounted thin-plate container 1 in a state in which the lid 3 is attached to the container body 2.
Figure 7:
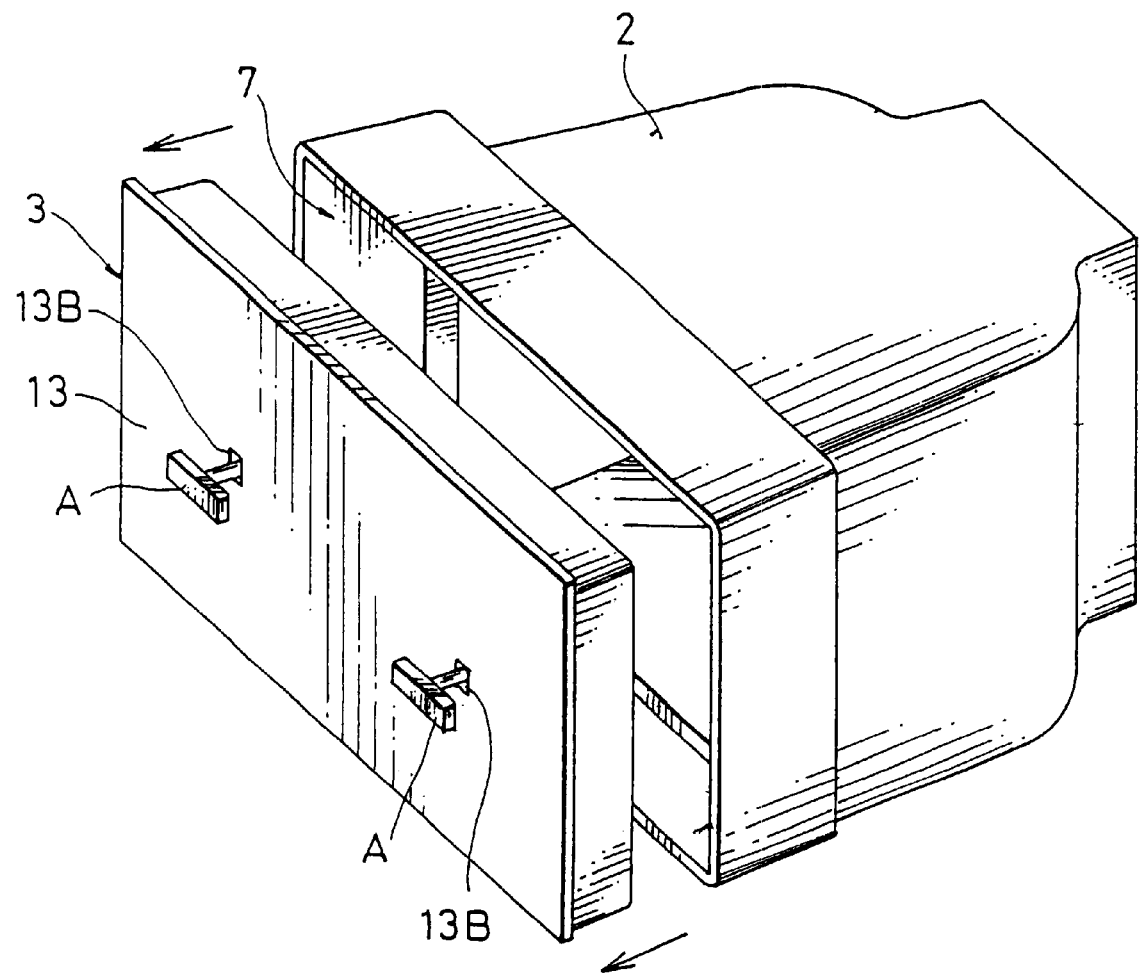
FIG. 7 is a perspective view showing the lid-mounted thin-plate container 1 in a state in which the lid 3 is removed from the container body 2.

In the lid-mounted thin-plate housing container 1 having the above-mentioned configuration, the lid 3 is automatically attached and detached in such a manner as shown in FIGS. 6 and 7.

Specifically, when the lid 3 is detached, the robot-arm fore-end portion A is oriented vertically and inserted into the long hole 13B of the lid plate 13. Subsequently, the robot-arm fore-end portion A is rotated by 45 degrees and engages with the long hole 13B. Concurrently, the rotational plate 25 is also rotated by 45 degrees, whereby each of the magnets 22 provided at the fore end portion of the arm 26 is moved by a distance a. Thereby, the magnets 22 are displaced by a distance a from the position where the magnets 22 have been aligned with the corresponding magnets 8 provided in the container body 2. Accordingly, the attractive magnetic force having been established therebetween disappears, whereby the lid 3, having been secured to the container body 2, is released therefrom. Subsequently, the robot-arm fore-end portion A is with drawn by the robot whereby the lid 3 is removed from the container body 2.

When the lid 3 is attached, the lid 3 supported by the robot-arm fore-end portion A is inserted into the lid housing portion 7 of the container body 2 contrary to the above-mentioned operations, and the robot-arm fore-end portion A is rotated by 45 degrees. Thereby, the respective magnets 22 are aligned with their corresponding magnets 8 so that the magnets 22 and 8 attract each other, whereby the lid 3 is secured to the container body 2.

At this occasion, the seal 14 functions at the last stage of the operation of housing the lid 3 into the lid housing portion 7 of the container body 2. Specifically, at the moment when the operation of housing the lid 3 into the lid housing portion 7 is completed, the tongue portion 14A of the seal 14 is clamped between the eaves 13A of the lid plate 13 and the abutting end portion 7B of the lid housing portion 7, whereby the interior of the container body 2 is sealed.

As described above, owing to the configuration in which the lid 3 is secured to the container body 2 by means of the magnetic force, no slidably contacting portion is formed when the lid 3 is secured to the container body 2, so that generation of dusts or the like caused by friction can be reliably prevented. Further, when the user attaches or detaches the lid 3, he has only to operate the magnetic force, for example, by displacing the magnets 22, so that he can easily attach or detach the lid 3, and also secure the lid 3 steadfastly.

Further, when the interior of the container body 2 is sealed, the tongue portion 14A of the seal 14 is clamped between the eaves 13A and the abutting end portion 7B at the last stage of the operation of housing the lid 3 into the lid housing portion 7 so as to seal the interior of the container body 2. Accordingly, after the sealing, the lid 3 hardly moves. Therefore, the internal atmospheric pressure within the container body 2 hardly rises when the lid 3 is attached.

Further, owing to the configuration in which the interior of the container body 2 is sealed by clamping the tongue portion 14A between the eaves 13A and the abutting end portion 7B, the sealing is reliably performed even when the lid body 12 of the lid 3 is smaller than the lid housing portion 7 and accordingly the lid 3 is displaced longitudinally or transversely within the lid housing portion 7.

Figure 8:
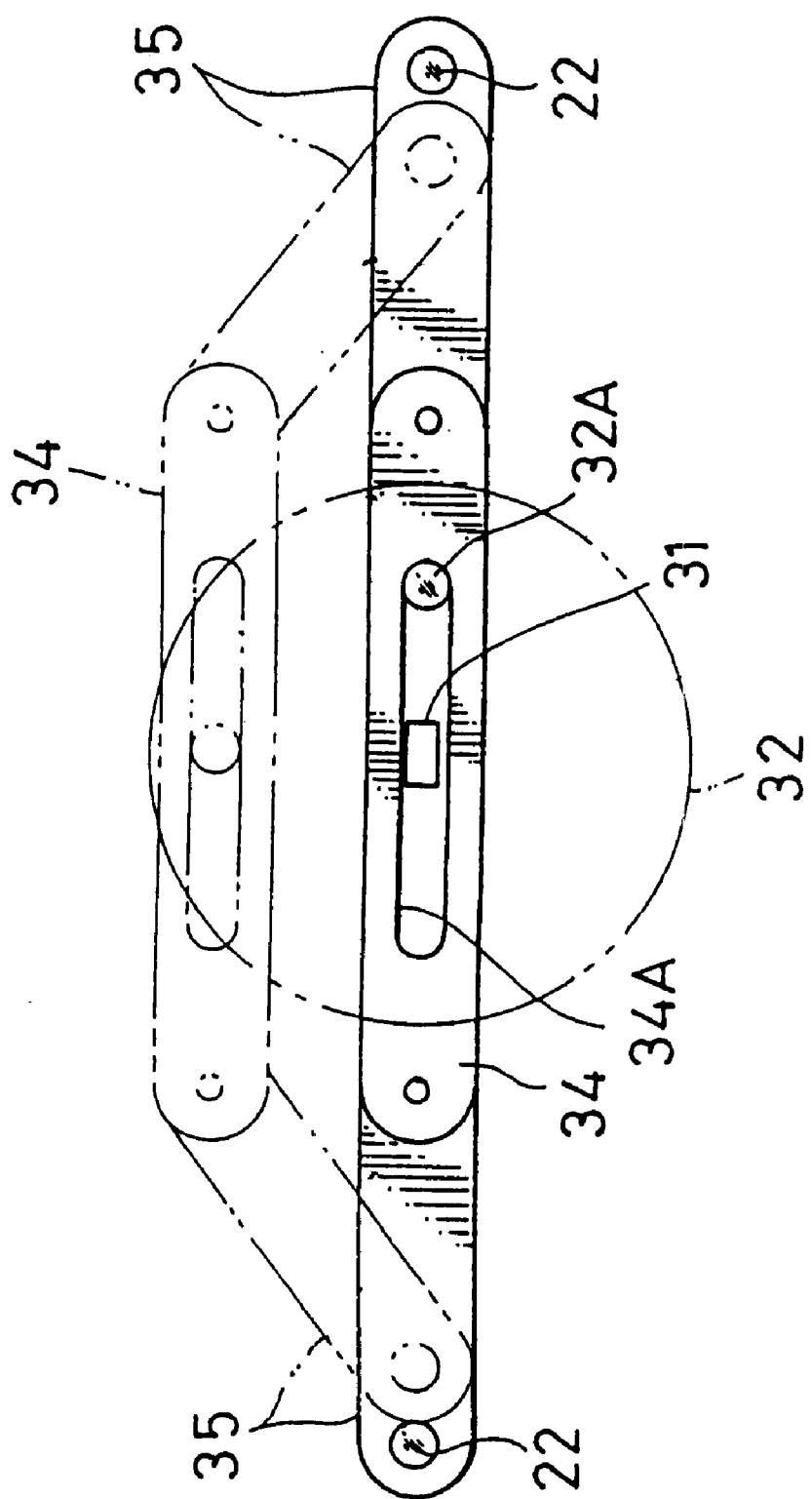
FIG. 8 is a plan view showing a first modification.

It should be noted that, while in the above-mentioned embodiment, the driving means 23 is so configured as to be constituted by the two arms 26, the driving means 23 may be constituted as a link mechanism as shown in FIG. 8. The driving means 23 of this configuration includes a rotational plate 32 having a long hole 31 at the center thereof, a upward-and-downward movement link 34 which is moved in parallel up and down by rotating the engagement pin 32A of the rotational plate 32 while keeping the engagement pin 32A engaged with the long groove 34A, and magnet supporting links 35, each of which has a base end connected to one end of the upward-and-downward movement link 34 and a fore end attached with one of the magnets 22. This configuration also exhibits the same operations and advantageous effects as in the above-mentioned embodiments.

Figure 9:
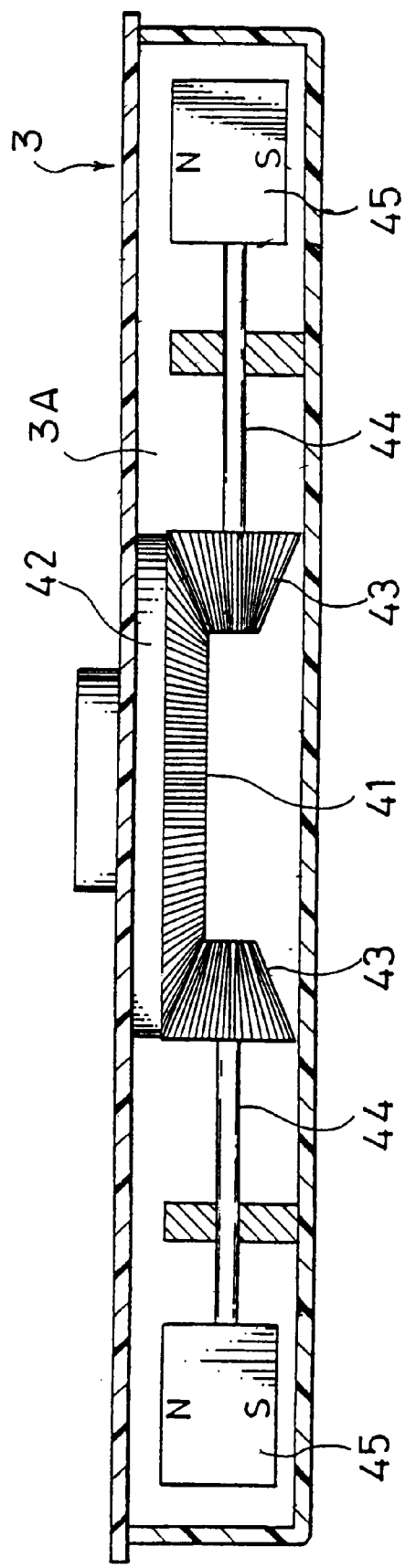
FIG. 9 is an elevational view showing a second modification.

Further, the magnetic force operating portion 11 may be configured as shown in FIG. 9. Specifically, the magnetic force operating portion 11 of the configuration shown in the chamber 3A in FIG. 9 includes a rotational plate 42 having a bevel gear 41 at the bottom surface thereof, bevel gears 43 each of which engages with the bevel gear of the rotational plate 42 from left or right, rotational shafts 44 each extending from each of the bevel gears 43, and magnets 45 provided at the fore end portion of each of the rotational shafts 44. In this configuration, when the rotational plate 42 is rotated by 45 degrees by the robot-arm fore-end portion A, each of the magnets 45 is rotated by 180 degrees via the bevel gear 43 and the rotational shaft 44 so that the N and S magnetic poles of the magnet 45 are reversed. Thereby, the lid 3 is secured on the container body 2, or the lid 3 having been secured to the container body 2 is released therefrom. This configuration also exhibits the same operations and advantageous effects as in the above-mentioned embodiment.

Figure 10:
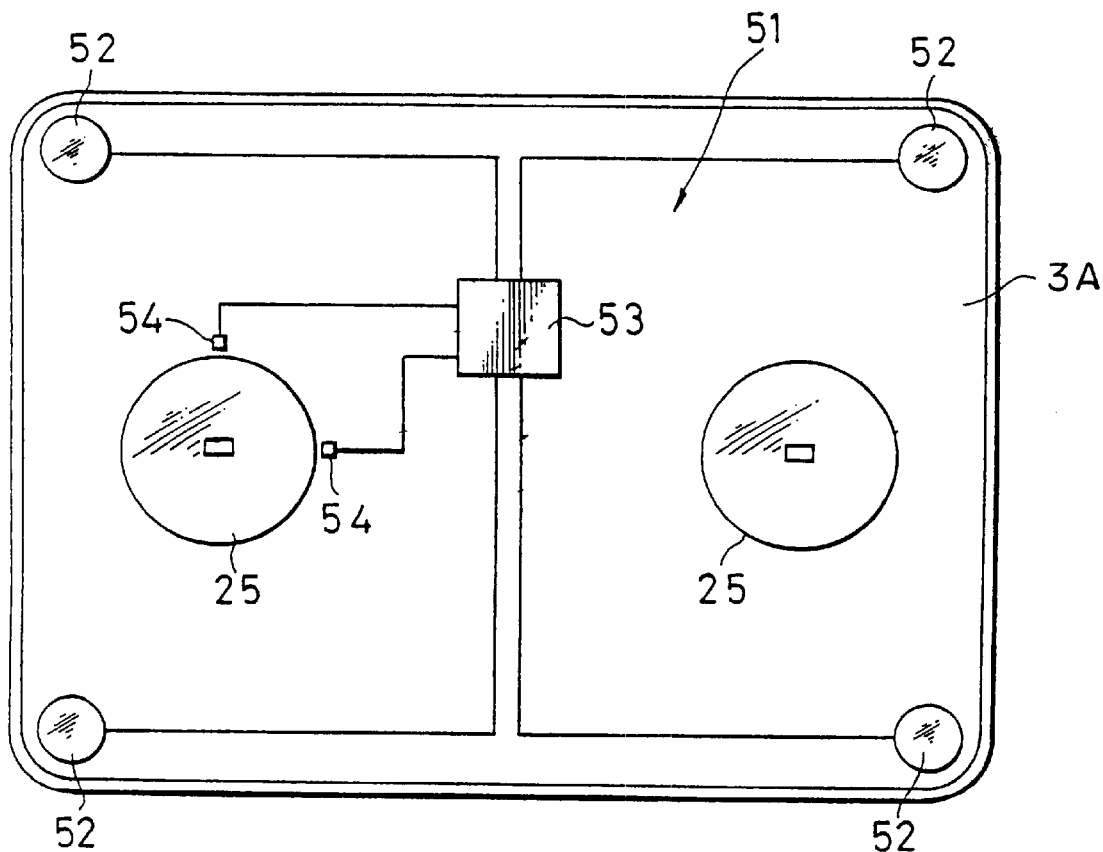
FIG. 10 is a plan view showing a third modification.
Figure 11:
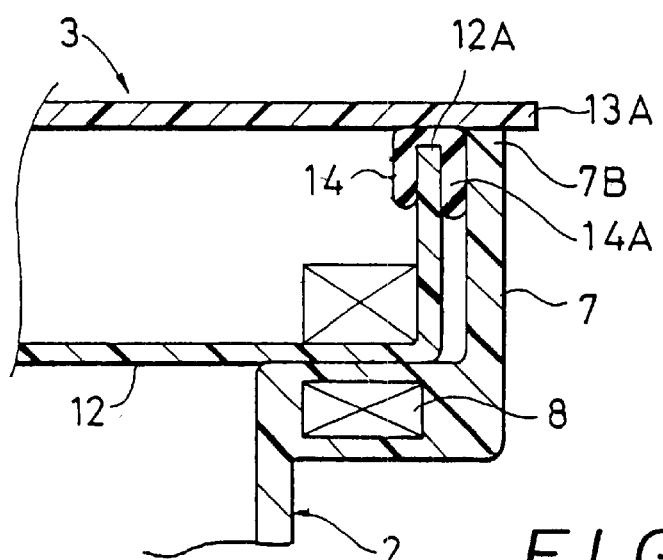
FIG. 11 is a sectional view showing a main portion of a fourth embodiment.

Further, in the above-mentioned embodiment and its modifications, magnets 8 and 22 are employed as means for operating the magnetic force provided in the magnetic force operating portion 11. Alternatively, a coil may be employed, in place of the magnets 8 and 22, as means for operating the magnetic force, as shown in FIG. 10. Specifically, a magnetic force operating unit 51 may be constituted by members made of magnetic substance (not shown) (a member made of magnetic substance is referred to "magnetic member" throughout the specification and the appended claims and abstract) provided at the four corners of the container body 2, coils 52 provided respectively at the four corners of the lid 3 (at the positions lying in chamber 3A in the lid body 12 and corresponding to the magnetic members), a control unit 53 in chamber 3A and which is connected to the coils 52 and has a built-in power supply for supplying electric current so as to control electric current to be supplied to the coil 52, and two sensors 54 provided in the vicinity of the circumference of the rotational plate 25. In this configuration, when the sensors 54 detect that the rotational plate 25 is rotated in a direction in which the lid 3 is secured, the control unit 53 controls electric current to be supplied to the coil 52 according to the detected result obtained by the sensors 54 so as to operate the magnetic force. Specifically, the lid 3 is secured to the container body 2 by causing electric current to flow in the direction in which the coil 52 and the magnetic member attract each other. In contrast, by stopping or reversing flow of the electric current, fixation of the lid 3 is eliminated, and then the lid 3 is removed by the robot. Note that, while in this configuration the coil 52 and its related members are provided on the lid 3, the coil 52 and its related members may be provided on the container body 2 if there is enough room to spare for attaching them.

Further, in the above-mentioned embodiment and its modifications, explanation is made by way of the configuration in which the electric force operating unit 11 is operated by a robot, and the lid 3 is attached and detached by the robot-arm fore-end portion A. Alternatively, a configuration in which the magnetic force operating unit 11 is operated by the user with his hand and the lid is manually attached and detached may be employed. This configuration also exhibits the same operations and advantageous effects as in the above-mentioned embodiment.

In the above-mentioned embodiment, the tongue portion 14A of the seal 14 is provided in such a manner as to be clamped between the eaves 13A and the abutting end portion 7B. Alternatively, the tongue portion 14A may be provided between the lid body 12 of the lid 3 and the lid housing portion 7. Specifically, in the case where the lid body 12 is smaller than the lid housing portion 7 and accordingly a gap in which the tongue portion 14A is interposed is formed, the tongue portion 14A is adhered on the outer surface of the abutting end portion 12A. Thereby, the tongue portion 14A is brought into contact with the inner surface of the abutting end portion 7B in a state that the tongue portion 14A is in contact with the outer surface of the abutting contact portion 12A, so that the tongue portion 14A seals the gap formed between the abutting end portion 12A and the abutting end portion 7B. This configuration also exhibits the same operations and advantageous effects as in the above-mentioned embodiment.

Further, in the configuration according to the above-mentioned embodiment, the four magnets 8 and 22 are respectively provided at the four corners. Alternatively, the numbers of magnets 8 and 22 may be 2, 3 or 5, respectively, in view of the size of the lid-mounted thin-plate housing container 1 and the attractive magnetic force needed. Further, the disposed direction of the magnets 8 and 22 is not limited to the up-and-down direction (the up-and-down direction in FIG. 2), but may be in the left-and-right direction. Specifically, the magnets 8 may be embedded in the side walls of the lid housing portion 7 so that the direction of the magnetic force may be oriented in the left-and-right direction.

Further, in the above-mentioned embodiment, on both of the container body 2 and the lid 3, the magnets 8 and 22 are provided. Alternatively, either of the magnets 8 and 22 may be replaced by members made of magnetic substance, such as iron or the like. This configuration also exhibits the above-mentioned operations and advantageous effects.

INDUSTRIAL APPLICABILITY

As described above, the lid-mounted thin-plate container 1 according to the present invention are useful when the container 1 is used for a carrier which needs to completely prevent dusts or the like from entering, and which houses hard memory disks (magnetic disks), substrates of compact disks (CD), silicon wafers used for producing semiconductors, glass substrates for LCD, and the like. Further, in addition to this use, the container 1 of the present invention can be used as a container in which the lid 3 is easily attached and detached, articles can be easily taken in and out, dusts or the like is prevented from generating, and the interior of the container body needs to be tightly sealed reliably.

What is claimed is:

1. A container for a plurality of thin plates comprising:
 a container body having an interior for receiving and supporting the plurality of thin plates;
 a lid for being detachably mounted on the container body for sealing the interior of the container body;
 a first magnetic member provided in the container body;
 a second magnetic member provided in the lid;
 one of said first and second magnetic members being a magnet;
 a rotatable plate; and
 an arm having one end attached to the rotatable plate and the second end attached to a movable magnetic member of said first and second magnetic members to move the movable magnetic member in response to rotation of the rotatable plate between first and second positions producing first and second magnetic conditions;
 said first magnetic condition being to generate a magnetic attractive force between the first and second magnetic members sufficient to secure the lid to the container body, and said second magnetic condition being to release attractive magnetic force between the first and second magnetic members sufficient to allow the lid to be freely removed from the container body.

2. A container for a plurality of thin plates according to claim 1 wherein said first magnetic member is embedded in said container body, said second magnetic member is the movable magnetic member, and said lid has a substantially enclosed chamber containing the second magnetic member.

3. A container for a plurality of thin plates comprising:

a container body having an interior for receiving and supporting the plurality of thin plates;

a lid for being detachably mounted on the container body for sealing the interior of the container body;

said lid having a substantially enclosed chamber formed therein;

a first magnetic member embedded in the container body;

a second magnetic member contained in the chamber in the lid; and driving means for operating one of said first and second magnetic members to selectively produce first and second magnetic conditions between said first and second magnetic members, said first magnetic condition being to generate a magnetic attractive force between the first and second magnetic members sufficient to secure the lid to the container body, and said second magnetic condition being to release attractive magnetic force between the first and second magnetic members sufficient to allow the lid to be freely removed from the container body wherein said driving means is contained in the chamber in the lid and said one magnetic member is said second magnetic member contained in the chamber in the lid.

4. A container for a plurality of thin plates comprising:

a container body having an interior with an open end for receiving and supporting the plurality of thin plates;

a lid for being detachably mounted on the container body for sealing the interior of the container body;

said lid including a lid body for being received in the open end of the container body, a lid plate covering a side of the lid body and extending radially outward from the lid body to engage the container body around the open end of the container body, and an enclosed chamber formed by the lid body and the lid plate;

a seal between the lid plate and lid body;

said seal having a tongue portion extending outwardly from said lid body around the lid body for engaging the container body to seal the interior of the container body;

a first magnetic member embedded in the container body;

a second magnetic member contained in the chamber in the lid; and driving means for operating one of said first and second magnetic members to selectively produce first and second magnetic conditions between said first and second members, said first magnetic condition being to generate a magnetic attractive force between the first and second magnetic members sufficient to secure the lid to the container body, and said second magnetic condition being to release attractive magnetic force between the first and second magnetic members sufficient to allow the lid to be freely removed from the container body.

* * * * *